United States Patent
Li et al.

(10) Patent No.: US 10,852,956 B1
(45) Date of Patent: Dec. 1, 2020

(54) STRUCTURE OF A HIGH-BANDWIDTH-MEMORY COMMAND QUEUE OF A MEMORY CONTROLLER WITH EXTERNAL PER-BANK REFRESH AND BURST REORDERING

(71) Applicant: Cadence Design Systems, Inc., San Jose, CA (US)

(72) Inventors: Ying Li, Shanghai (CN); Xiaofei Li, Beijing (CN); Yanjuan Zhan, Beijing (CN); Zhehong Qian, Shanghai (CN); Buying Du, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 470 days.

(21) Appl. No.: 15/199,951

(22) Filed: Jun. 30, 2016

(51) Int. Cl.
*G06F 3/06* (2006.01)
*G06F 12/00* (2006.01)

(52) U.S. Cl.
CPC .......... *G06F 3/0619* (2013.01); *G06F 3/0659* (2013.01); *G06F 3/0673* (2013.01)

(58) Field of Classification Search
CPC ......... G06F 12/00; G06F 13/00; G06F 3/0619
USPC .......................................... 711/100, 154, 169
See application file for complete search history.

(56) References Cited

U.S. PATENT DOCUMENTS

| | | | | |
|---|---|---|---|---|
| 2008/0126641 | A1* | 5/2008 | Irish | G06F 13/1631 710/112 |
| 2010/0037014 | A1* | 2/2010 | Lim | G11C 7/22 711/105 |
| 2017/0228175 | A1* | 8/2017 | Kim | G06F 3/0619 |

* cited by examiner

*Primary Examiner* — Tuan V Thai
(74) *Attorney, Agent, or Firm* — Vista IP Law Group, LLP

(57) ABSTRACT

Embodiments of the invention provide a novel structure of a high-bandwidth-memory command queue of a memory controller with external per-bank refresh and DRAM burst reordering. Where the external per-bank refresh removes some of the unpredictable nature of PBR commands and DRAM burst reordering provides for efficient utilization of memory bandwidth.

20 Claims, 28 Drawing Sheets

RW And PBR Command Queue 534

| Entry # | Refresh Bank | RW Bank | R/W | Burst Length |
|---|---|---|---|---|
| 1 | 2 | 1 | R | 6 |
| 2 | | | | |
| 3 | | | | |
| 4 | | | | |

DRAM Interface Refresh Channel

DRAM Interface RW Channel

Cycles

RW And PBR Command Queue 534

| Entry # | Refresh Bank | RW Bank | R/W | Burst Length |
|---------|--------------|---------|-----|--------------|
| 1 | 2 | 1 | R | 6 |
| 2 | 3 | 5 | R | 2 |
| 3 | | | | |
| 4 | | | | |

RW And PBR Command Queue 534

| Entry # | Refresh Bank | RW Bank | R/W | Burst Length |
|---|---|---|---|---|
| 1 | 2 | 1 | R | 6 |
| 2 | 3 | 5 | R | 2 |
| 3 | 10 | 7 | R | 4 |
| 4 | | | | |

| Refresh Bank 2 | | | | | | | | | | | Refresh Bank 3 | | | |
|---|---|---|---|---|---|---|---|---|---|---|---|---|---|---|
| BA1 | BA1 | BA1 | BA1 | BA1 | BA1 | BA1 | BA1 | BA1 | BA1 | BA1 | | BA5 | BA5 | |
| 1 | 2 | 3 | 4 | 5 | 6 | 7 | 8 | 9 | 10 | 11 | 12 | 13 | 14 | 15 | 16 |

DRAM Interface Refresh Channel

DRAM Interface RW Channel

Cycles

STRUCTURE OF A HIGH-BANDWIDTH-MEMORY COMMAND QUEUE OF A MEMORY CONTROLLER WITH EXTERNAL PER-BANK REFRESH AND BURST REORDERING

FIELD

This disclosure relates to the field of memory controllers.

BACKGROUND

Modern electronics rely heavily on memory. This is because memory is central to a vast majority of computing operations. For instance, running an application on a device, such as a cell phone, a tablet, personal computer or other devices, will require the utilization of memory. This memory can be in the form of persistent storage, such as solid state drives (SSDs), hard disk drives (HDDs), or even tape drives. However, persistent storage tends to be slower than non-persistent storage such as random access memory (RAM).

Despite the speed with which RAM can serve up data, certain types of RAM such as dynamic random access memory (DRAM) and the newer high bandwidth memory dynamic random access memory (HBM DRAM) come with their own drawbacks. For instance, these memories are not persistent, meaning that generally when power is lost the memory will not retain the data stored in its memory banks. Furthermore, these memories require that memory cells be refreshed periodically and after reads. The refresh requirement is a result of the design of the memory cells themselves which normally consist of a single transistor in line with a capacitive element. These capacitive elements suffer from two main issues, first they suffer from charge leakage over time necessitating a refresh regardless of whether the cell was accessed or not, and second they suffer from pollution from the bit line voltage during read operations. Specifically, in a normal read operation the bit line will be charged to half the supply voltage, then the appropriate bit to be read on that bit line will be accessed by turning on the transistor between the bit line and the capacitive element. When this happens the capacitive element will pull the charge of the bit line either closer to the supply voltage or closer to zero. However, in both cases charge of the capacitive element will be moved closer to half of the supply voltage because the capacitive element will lose some of its charge to pull the bit line higher or gain some charge by pulling the bit line down.

In order to address the refresh requirement of these memories, some memory controllers have been constructed to issue per bank refresh commands (PBR). In order to determine which bank should be refreshed, the PBR generator usually attempts to select a recently idle bank. This works fine on some occasions, but on others the memory controller might issue a PBR command to a bank that needs to be accessed next—in other words the issued command causes a collision between the bank to be refreshed and the access command. When this happens there is a delay (refresh to read/write delay) before that particular bank can be accessed, as a result there is a lost opportunity to perform useful work. Furthermore, because this delay is unplanned it can cause further problems for time sensitive applications due the unpredictability of when collisions will occur.

Bank group rotation is another technique which is used to improve throughput but which may also increase the likelihood that a collision will occur. The reason for this becomes apparent when it is determined how bank group rotation works. Bank group rotation works by alternating the banks which are accessed for a particular command. For instance, a burst of length 6 might access bank 1, then 5, then 1, then 5, then 1, and finally 5. This practice can improve performance in some respects because after each individual bank is accessed there is a required delay before that same bank can be accessed again, so when bank accesses are alternated more useful work can be performed while waiting the required delay period for the other bank and vice versa. However, as a result of accessing both banks, both banks now require a PBR command, which essentially doubles the chance that a PBR command might cause a collision with a later command.

Therefore, there is a need for an improved approach to performing PBR functions.

SUMMARY

Embodiments of the invention provide a novel structure of a high-bandwidth-memory command queue of a memory controller with external per-bank refresh (PBR) and burst reordering. In contrast to prior techniques, the present disclosure provides an external PBR interface that can be used to schedule PBR commands as appropriate by the element transmitting the memory commands. In this way the unpredictable nature of PBR commands generated by a memory controller can be avoided or controlled.

In some embodiments, the process also includes a scheduling apparatus where, the scheduling apparatus may be used to service alternating commands in a prioritized fashion such that another bank can be accessed during the required delay period of a different bank.

In some embodiments, the memory controller could also include multiple modes, where a first mode requires all externally generated PBR commands, a second mode supports only internally generated PBR commands, and a third mode that supports both internally and externally generated PBR commands, such that legacy devices could be supported which do not include the PBR feature.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Various embodiments will now be described in detail with reference to the drawings, which are provided as illustrative examples of the invention so as to enable those skilled in the art to practice the invention. Notably, the figures and the examples are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
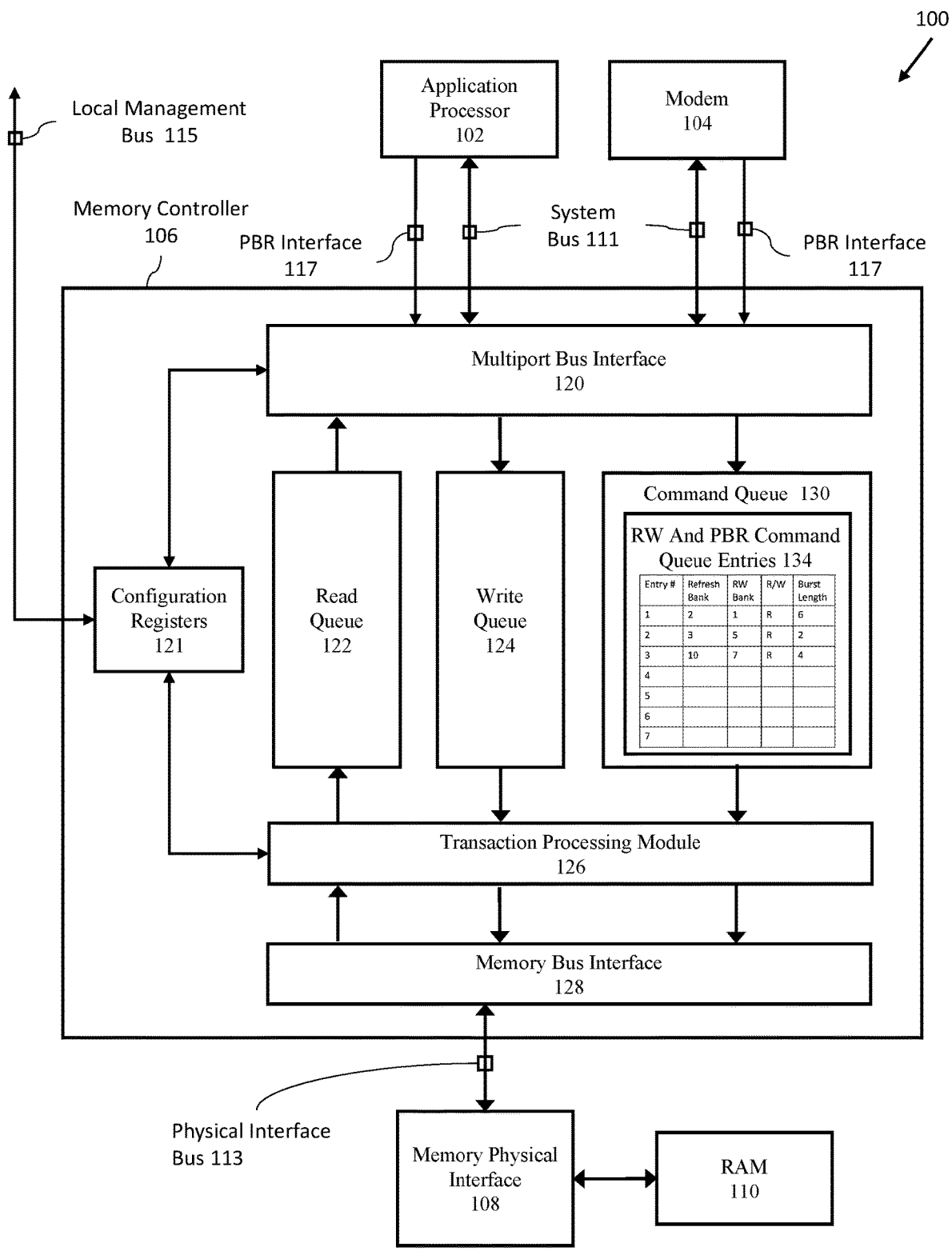
FIG. 1 illustrates an example system including a memory controller in which some embodiments of the invention may be implemented.

FIG. 1 illustrates an example system including a memory controller in which some embodiments of the invention may be implemented. The system includes the recited memory controller, which may be connected to one or more processing devices, and to a memory respectively for providing memory access.

The system 100, as illustrated, provides an application processor 102 and a modem 104 that are both electrically coupled to a memory controller 106 via system bus 111 and per bank refresh (PBR) interface 117. The memory controller 106 is electrically coupled to a RAM 110 through a memory physical interface 108 and via a physical interface bus 113. Additionally, the memory controller 106 is connected to a local management bus 115. The memory controller 106 itself includes a multiport bus interface 120, a read queue 122, a write queue 124, a command queue 130 which may itself include read/write command queue entries 134, a transaction processing module 126, a memory bus interface 128, and configuration registers 121.

In some embodiments, an application processor 102 may be included as illustrated. For instance, in a cellular device a system would likely include both the application processor 102 and a modem 104. The application processor generally performs the processing for most applications, while the modem generally performs the processing for wireless communications. In some embodiments, the modem 104 and/or application processor 102 may include additional local memory (cache), and may also be connected to other systems and components. In some embodiments, there may be one or more other processors or only one processor. In some embodiments, there may be one or more processing elements that access memory via the memory controller 106, or arrays of processing elements, such as in an implementation for a graphics processing unit (GPU) or a field programmable gate array (FPGA).

In some embodiments, a system bus 111 is provided for connecting the memory controller to one or more processing elements. The system bus might implement one or more bus protocols such as the AMBA bus protocols which includes at least the advanced extensible interface (AXI), Advance high-performance bus (AHB), or any other appropriate proprietary or non-proprietary bus protocol.

The per bank refresh (PBR) interface 117 provides for connection to the memory controller in order to enable processing elements such as the application processor 102 to specify which memory bank, if any, should perform a per bank refresh and at what time. For instance, in some embodiments the PBR interface could be used to transmit a PBR command to the memory controller synchronously with a particular memory access command. In some embodiments, the PBR command could be transmitted asynchronously with respect to memory access commands transmitted on the system bus 111.

The multiport bus interface 120 provides support for one or more bus protocols such as those discussed above. In addition, the multiport bus interface 120 enables communication between the read queue 122, write queue 124, and the command queue 130. Additionally, the multiport bus interface 120 provides support for communications over the PBR interface, such as by receiving PBR commands over the PBR interface and transmitting them to the command queue 130.

The read queue 122 provides a queue or buffer or other data storage structure for temporarily holding data read from the memory. By temporarily holding data read from memory the read queue 122 can be used to hold data for transmission at the appropriate time, for buffering data into larger sections of data such as for burst transmissions, and generally for storing data such that the data can be held in a location other than the RAM 110 or the memory physical interface 108 pending transmission to the requesting element, such as application processor 102 or modem 104.

The write queue 124 is similarly structured and serves a similar function as the read queue 122. However, where the read queue holds data that has been read from the RAM 110 for later transmission, the write queue 124 holds data to be written to the RAM 110 after it has been transmitted to the memory controller 106. In this way the write queue 124 provides temporary storage that holds data until it is ready to be written to the RAM 110 and to collect multiple pieces of data for writing to the memory at once, such as by collecting burst transmissions. In this way the write queue 124 and the read queue 122 both serve to provide structures for separating the transmission of the read/write data over the system bus 111 from the read/write of data over the physical interface bus 113.

The command queue 130 provides the structure necessary to track the pending commands using a unified read/write and per-bank refresh (PBR) Command Queue 134. As will be discussed in greater detail in regard to FIGS. 5A-J and 6A-M, the command queue contains storage for a number of entries, where each entry may correspond to both a bank refresh and a memory read or write operation. In this way, the command queue can store the read/write commands and the PBR commands in a manner that maintains the timing relationship between the read/write commands and the PBR commands. In some embodiments, the memory controller or the command queue, may receive one or more transactions. These transactions may be translated by the memory controller or command queue into one or more memory access commands. However, in the interests of simplicity, throughout this application memory access commands will be used to refer to both memory access commands and memory transactions.

The transaction processing module 126 receives one or more entries from the read/write and PBR queue 134 and performs the necessary steps to issue corresponding instructions. Furthermore, the transaction processing module 126 may also perform any tracking/monitoring activities and potentially scheduling activities as will be discussed further in regard to FIGS. 5A-J and 6A-M.

The memory bus interface 128 is configured to be able to communicate with the memory physical interface 108. The memory bus interface 128, provides support for one or more bus protocols such as the DDR PHY Interface (DFI), or other proprietary or non-proprietary protocols. In addition, the memory bus interface 128 enables communication between the transaction processing module 126, and the memory physical interface 108.

The memory physical interface 113 provides electrical coupling between the memory bus interface 128 and the memory physical interface 108. The memory bus interface may support one or more bus protocols as discussed above.

The memory physical interface 108 provides the interface elements for electrically coupling the RAM 110 to the physical interface bus 113. For instance, the memory physical interface 108 might include circuits to translate addresses into appropriate rows and columns, to control the writing of data, to control the reading of data, to control the refresh process, and other necessary function as is known.

The random access memory (RAM) 110 is electrically coupled to the memory physical interface. The memory could be any form of dynamic random-access memory (DRAM), however, the most common forms of DRAM are synchronous DRAM (SDRAM) such as double data rate (DDR) SDRAM and graphics double data rate (GDDR) SDRAM in various different speed grades. Most relevant here are DRAM memories that utilize the high bandwidth memory interface (HBM DRAM), though any memory with similar refresh requirements as DRAM could benefit from the inventive aspects as recited herein.

The configuration registers 121 are electrically connected to the multiport bus interface 120, the transaction processing module 126 and a local management bus 115. As is known in the art, such configuration registers can be used to select which bus protocol is used or various aspects of how transactions are to the processed by the transaction processing module 126, as set via the local management bus 115 buy a system controller or processor. Furthermore, in some embodiments the configuration registers may be used to control other aspects of the memory controller 106, such as behavior of the command queue 130 including how entries are managed in the Read/Write and Command Queue 134.

Figure 2:
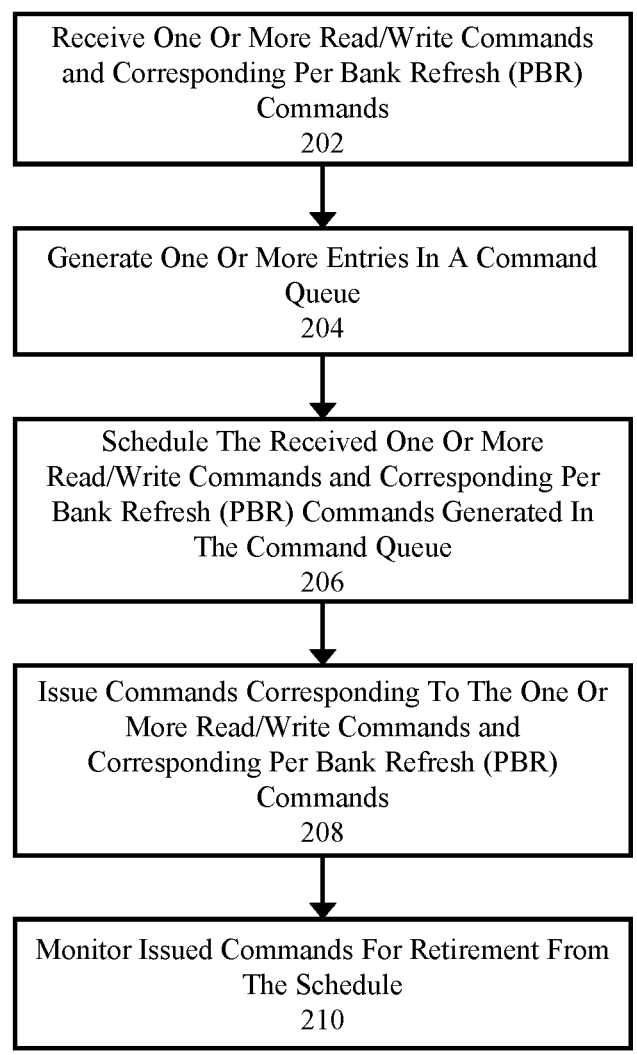
FIG. 2 illustrates a process flow according to some embodiments of the invention.

FIG. 2 illustrates a process flow according to some embodiments of the invention. The process generally includes receiving one or more commands, generating entries in a queue, scheduling those entries for processing, issuing those commands and then finally retiring those commands. Such commands may be received in various different manners and at various different time, and even from various different sources. However, in its simplest form, the process flow could be used to provide access to a single set of memory devices on behalf of a single accessing element.

At 202, one or more read/write commands and corresponding per bank refresh (PBR) commands are received. The commands could be received synchronously or asynchronously. The read/write commands are generated as a result of one or more processing elements as is known in the art. For instance, a processing element might request a particular piece of data from a local cache, which in turn may generate a corresponding command to the memory controller when the particular piece of data is not found within the cache. Furthermore, the processor might know what data it expects to read/write or otherwise access next, and what data was recently accessed. Therefore, the processor can use this information and other information to determine which memory bank it is likely to access next, and further which memory bank should be refreshed along with a particular memory access command.

At 204, one or more entries in a command queue may be generated. These entries will be discussed in further detail in regard to FIGS. 5A-J and 6A-M. However, for the sake of clarity operation of the command queue is briefly covered here. First the entries in the command queue provide a single entry that specifies an access operation (read or write) and potentially a corresponding bank refresh command. As a result, the command queue provides a structure to store data that can be used to issue an access command along with a PBR command for a particular bank while maintaining a timing/ordering relationship between the two commands.

At 206, the received one or more read/write commands and corresponding per bank refresh (PBR) commands generated in the command queue may be scheduled. There are many ways to perform scheduling. For instance, scheduling may be performed using score boarding, or a queue may be populated in a specific order, or specific ports or registers may be used corresponding to the number of possible commands that may be active during the same overall time period, or data structures such as the read/write queue may be populated with additional data to order the commands, any of which or some combination thereof may be appropriate here.

At 208, commands corresponding to the one or more read/write commands and corresponding per bank refresh (PBR) commands may be issued. Read/write commands are generally known in the art. However, additional steps may be necessary to account for issuing the PBR commands and for scheduling activities as will be discussed below in FIGS. 3-4 below.

Finally, at 210 the issued commands may be monitored for retirement from the schedule and from the read/write and PBR command queue 134 as necessary. Monitoring may be accomplished by various techniques such as using counters, monitoring the data in the read and/or write queues 122 and 124 respectively, or monitoring the issue and response communications or some combination thereof. Once the memory controller 106 determines that a particular entry is completed it can be removed from tracking or other data structures or marked in some way to indicate that it is completed.

Figure 3:
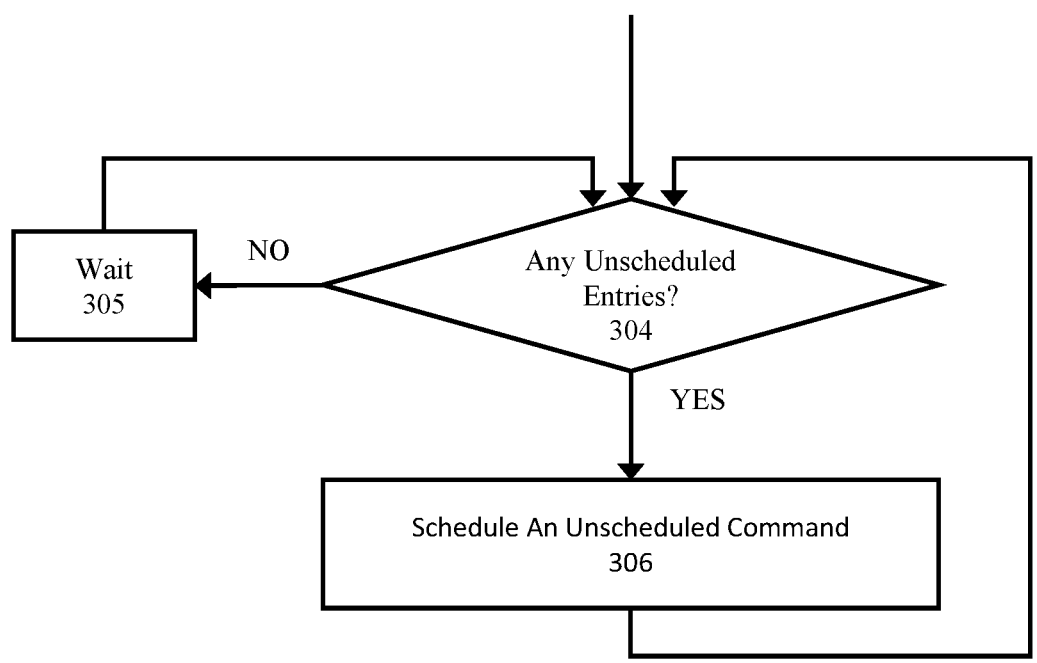
FIG. 3 illustrates an expanded view of the process of scheduling commands shown in FIG. 2 according to some embodiments of the invention.

FIG. 3 illustrates an expanded view of the process of scheduling commands shown in FIG. 2 according to some embodiments of the invention. Alternative methods of scheduling may be appropriate. However, the figure illustrates one way in which entries can be identified and scheduled in an efficient manner, by determining if there are any entries that are unscheduled before attempting to schedule events, and waiting an appropriate period of time before trying to schedule events again when there are no unscheduled events.

At 304, the process determines if there are any unscheduled entries. This process may be triggered by the receipt of one or more signals. For instance, the process could be triggered by an automatic process flow which causes the command queue to transmit any unscheduled entries, a signal that indicates that there may be an unscheduled entry such as a not empty signal, or both. In some embodiments, the process could be triggered by a signal that indicates that there is an unscheduled command, in which case the process may first determine which of the unscheduled commands to schedule and then proceed to 306 to schedule a command. Finally, the process could be triggered by the completion of one or more scheduling events at 306 or by the expiration of a waiting period at 305. This can be performed using any appropriate technique. For instance, the scheduled entries may be removed from the read/write and PBR command queue. Or in the alternative, additional columns could be added to the command read/write and PBR command queue for scheduling management.

If at 304 it is determined that there are no unscheduled entries, then the process continues at 305 where the process is halted for a period of time as appropriate before another check is made as to whether the command queue has any unscheduled entries. However, if at 304 it is determined that there are one or more unscheduled commands in the read/write command queue, then the process continues at 306.

At 306, the process schedules one or more unscheduled commands. Such scheduling can occur according to one or more rules. For instance, a scheduling method may include three entries, a first for scheduling the PBR commands, a second for scheduling a command to be issued for even cycles, and a third entree for scheduling odd cycle commands. Furthermore, scheduling activities can take into account the order that the commands to be scheduled were received in, such that commands that have been in the read/write and PBR command queue longer are scheduled before other commands. After one or more unscheduled commands are scheduled the process returns to 304.

Furthermore, while FIG. 3 illustrates one process flow for scheduling read/write and PBR command queue commands, there are many other variations that may be used to scheduled commands, any of which could be appropriate here. For instance, one such process might use status signals that obviate the need to check the status of the read/write and PBR command queue, or commands in the read/write and PBR command queue could be scheduled as they are received and entered into the command queue.

Figure 4:
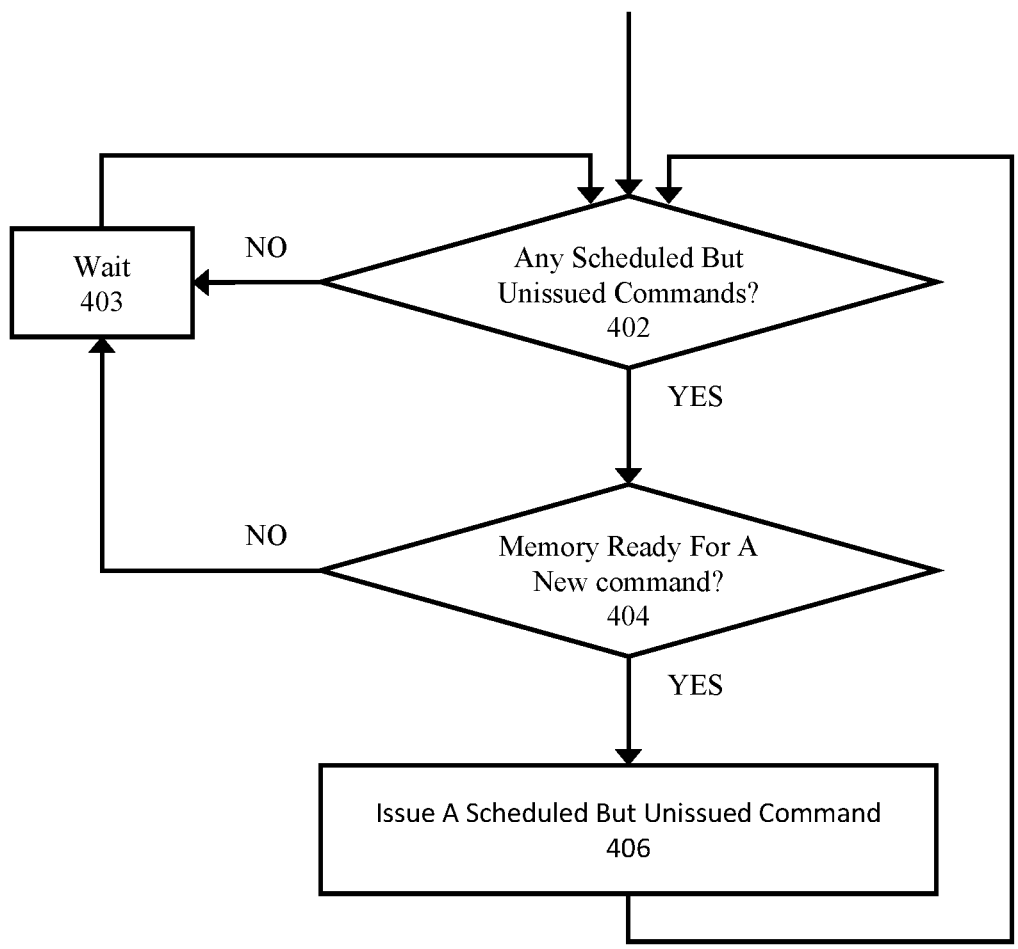
FIG. 4 illustrates an expanded view of the process to issue commands shown in FIG. 2 according to some embodiments of the invention.

FIG. 4 illustrates an expanded view of the process to issue commands shown in FIG. 2 according to some embodiments of the invention. The process generally includes determining if there are any scheduled but unissued commands, and if the memory is ready to receive additional commands issuing those commands to memory. Furthermore, in order to process such command efficiently the process may be triggered by one or more control signals and may include a wait period in order to avoid excessive accesses to the command queue such as when the memory interface for issuing commands is already busy or expected to be busy, or the memory itself is busy.

At 402, the process determines if there are any scheduled but unissued commands. The process may be triggered by one or more control signals or by receiving one or more commands from the command queue for processing or some combination thereof. Furthermore, the process may be triggered by the completion of issuing one or more commands at 406 or by the expiration of a waiting period at 403. If there are no commands that are scheduled but unissued commands then the process continues at 403, otherwise the process continues at 404. This step serves to insure the efficient operation of the process, by stopping any further processing for issuing commands when there are no commands to be issued.

At 404, the process determines if the memory is ready to receive a new command. If the memory is otherwise busy then the process returns to 403 where the process waits for an appropriate period of time. Otherwise the process continues at 406 where one or more commands are issued to the memory as determined by the schedule.

Furthermore, while FIG. 4 illustrates one process flow for issuing scheduled read/write and PBR command queue commands, there are many other variations that may be used to determine when to issue scheduled commands, any of which could appropriately be used herein. For instance, one such method might use status signals that obviate the need to check the status of the memory in combination with combinatorial logic which is trigger automatically when there are unscheduled commands. Other process flows may only be triggered when the memory is otherwise ready or will be ready for a new memory command/transaction.

FIGS. 5A-J and 6A-M illustrates an examples of the operation of a memory controller in which some embodiments of the invention may be implemented.

FIGS. 5A-J illustrates an example operation of a memory controller in which some embodiments of the invention may be implemented.

Figure 5A:
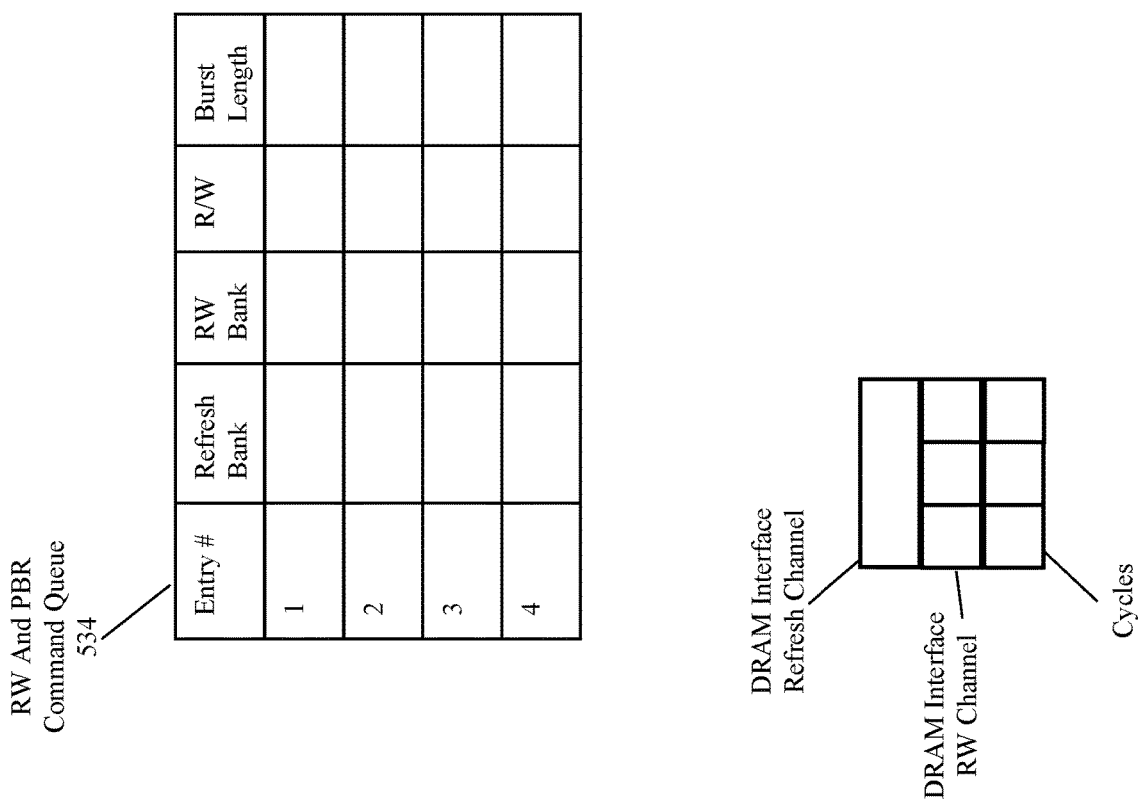
FIGS. 5A-J illustrates an example operation of a memory controller in which some embodiments of the invention may be implemented.

FIG. 5A illustrates the initial state in the example operation of a memory controller in which some embodiments of the invention may be implemented. Specifically, the illustration includes read/write (RW) and per-bank refresh (PBR) command queue 534, and an illustrative view of the refresh activity on the DRAM interface refresh channel, read/write activity on the DRAM interface RW channel, and the corresponding cycles.

The RW and PBR command queue 534 as illustrated includes five columns: entry #, refresh bank, RW bank, R/W, and burst length. The entry # column is illustrated as being populated with the numbers 1-4 for simplicity, though in an actual system the entries numbers may or may not be necessary. Furthermore, the DRAM interface refresh channel, the DRAM interface RW channel, and the cycles are illustrated as blank place holders. Thereby, FIG. 5A illustrates an initial empty state.

Figure 5B:
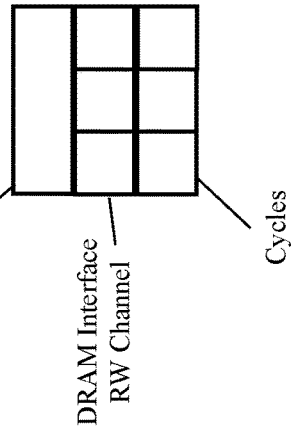

FIG. 5B illustrates the receipt of a first pair of commands corresponding to a first entry.

The first entry has been stored as entry #1, and includes and a PBR command as indicated by the number 2 in the column labeled refresh bank, and a burst read command as indicated by the remaining columns. Specifically, the value corresponding to entry #1 in the column labeled RW Bank specifies that the command will utilize bank 1 as represented by the number 1 in that column. The value corresponding to entry #1 in the column labeled R/W specifies that the command is a read command as indicated by the R in that column. Finally, the value corresponding to entry #1 in the column labeled burst length specifies that the command is a burst command, of length 6 as indicated by the number 6 in that column.

FIG. 5B does not illustrate any scheduling of the commands in entry #1, instead that illustration is provided below.

Figure 5C:
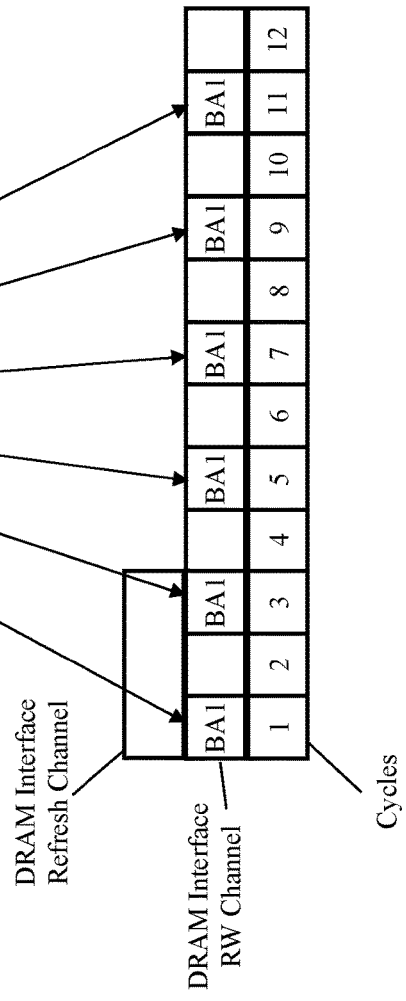

FIG. 5C illustrates scheduling of the read commands. Specifically, the DRAM interface RW channel has been populated with bank access 1 (BA1) commands at the corresponding cycles.

Furthermore, because there is a required delay between subsequent reads to the same bank (illustrated here as being equal to a cycle for simplicity) the DRAM interface RW channel is illustrated as accessing bank 1 during each odd numbered cycle listed, and is illustrated as being idle each even numbered cycle listed.

Figure 5D:
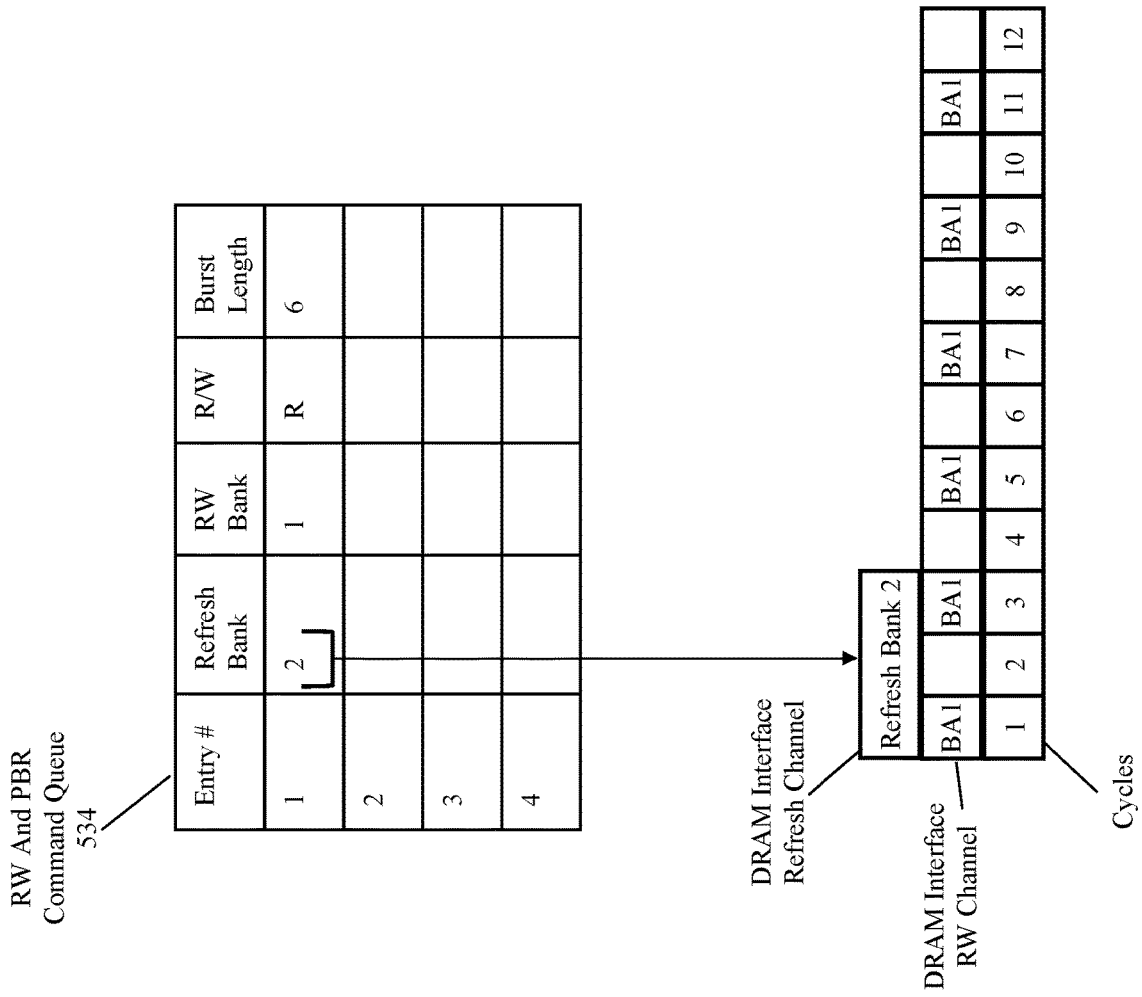

FIG. 5D illustrates the scheduling of the PBR command. Specifically, the DRAM interface refresh channel has been populated for the corresponding cycles.

As illustrated here, the scheduling of the PBR and the read operation are illustrated as occurring at separate times.

While in certain situations this may be the preferred order, in some cases, the PBR may be scheduled at the same time. However, in certain circumstances the read command and the PBR may need to be scheduled separately because the bus may be busy, or because other PBR commands are pending prior to this particular PBR command.

Figure 5E:
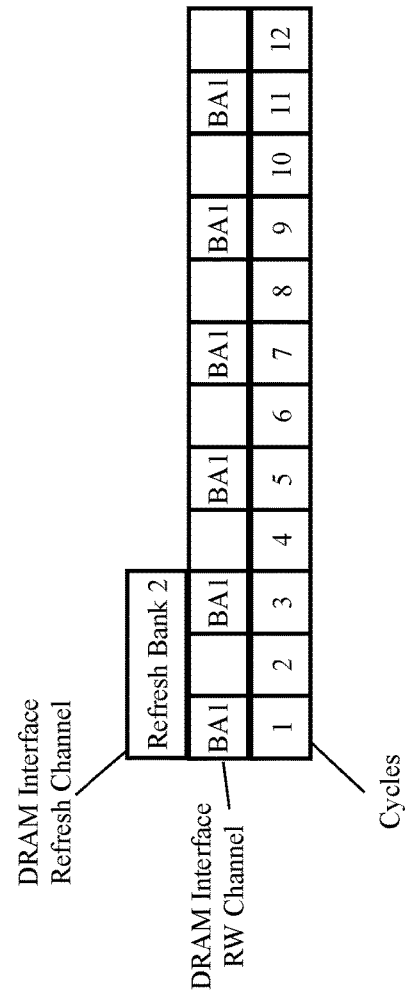

FIG. 5E illustrates the arrival of a second set of commands which have been entered into the read/write and PBR command queue at entry #2. As illustrated, the second set of commands include a refresh of bank 3, an access of bank 5, an access type of read, and a burst length of 2. However, FIG. 5D does not illustrate this entry as being scheduled at this time.

Figure 5F:
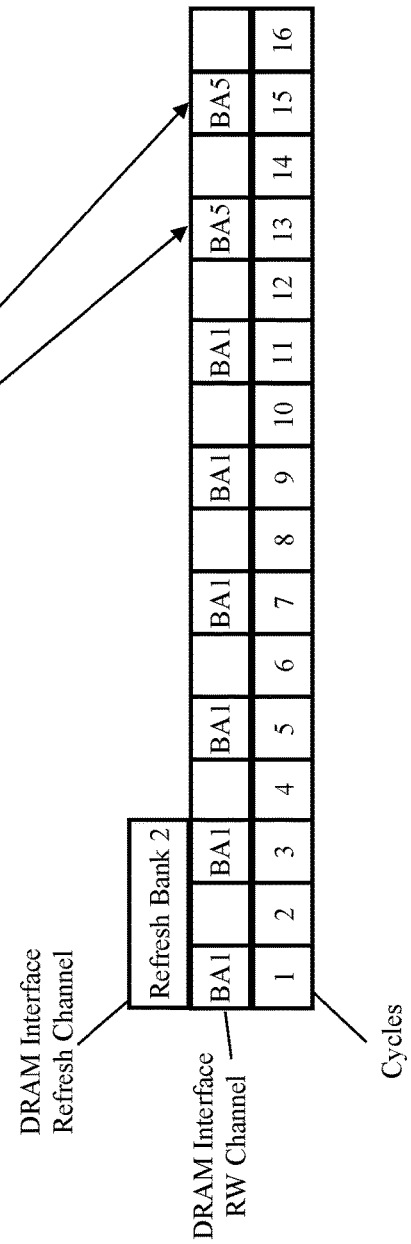

FIG. 5F illustrates the scheduling of the read command in entry #2. Specifically, the read command has been scheduled to start initially at cycle 13 and is projected to be completed during cycle 15. In this way, a simple form of scheduling can occur such that memory access commands can be scheduled such that interference is minimized and made predictable.

Figure 5G:
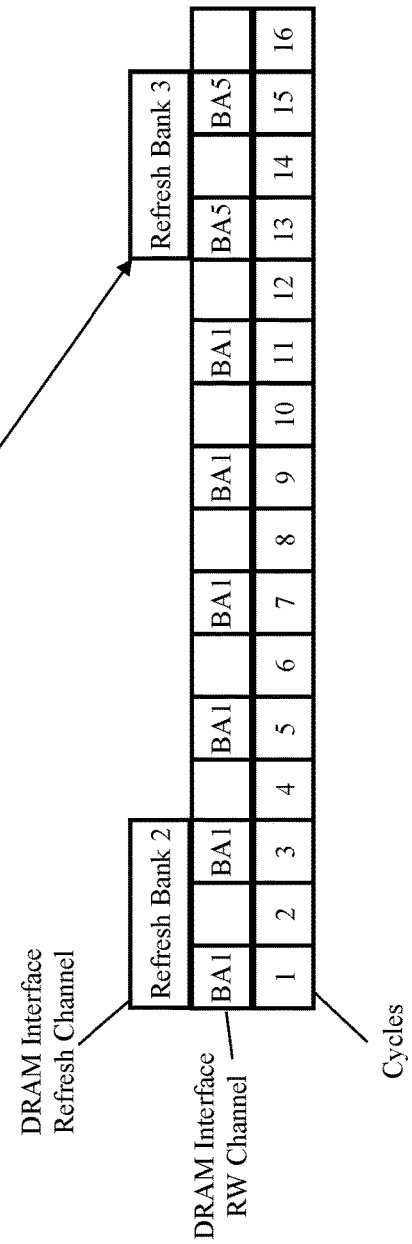

FIG. 5G illustrates the scheduling of the PBR command in entry #2. Specifically, the PBR command has been scheduled to start initially at cycle 13 and is projected to be completed during cycle 15. In this way, a simple form of scheduling can occur such that memory access commands and PBR commands can be scheduled such that interference between the two is minimized and made predictable.

Figure 5H:

FIG. 5H provides the arrival of a final set of commands in entry #3. As illustrated, the third set of commands include a refresh of bank 10, an access of bank 7, an access type of read, and a burst length of 4. However, as before FIG. 5F does not illustrate this entry as being scheduled at this time.

Figure 5I:
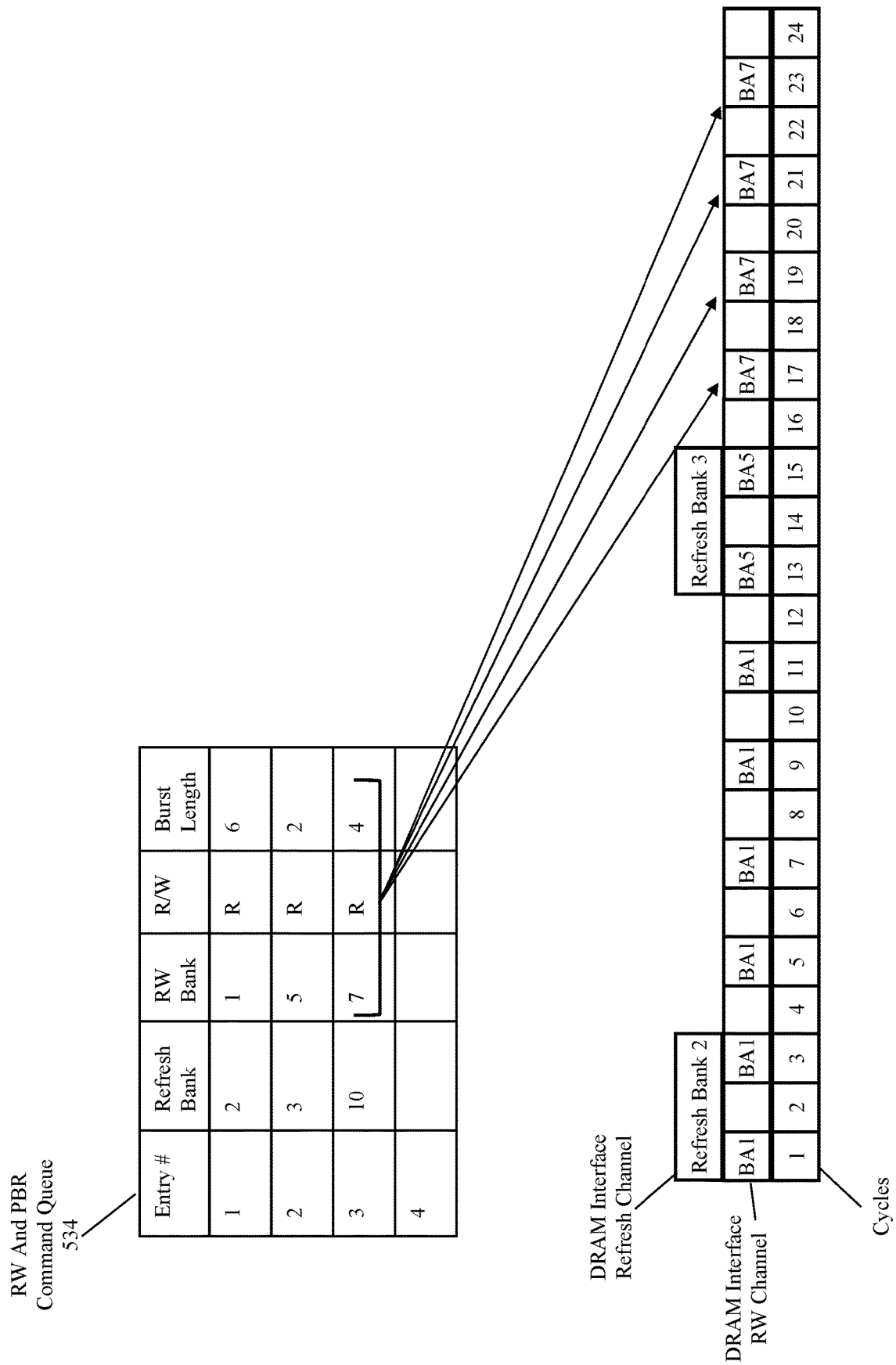

FIG. 5I illustrates the scheduling of the read command in entry #3. The read command has been scheduled to start initially at cycle 17, and is projected to be completed during cycle 24.

Figure 5J:
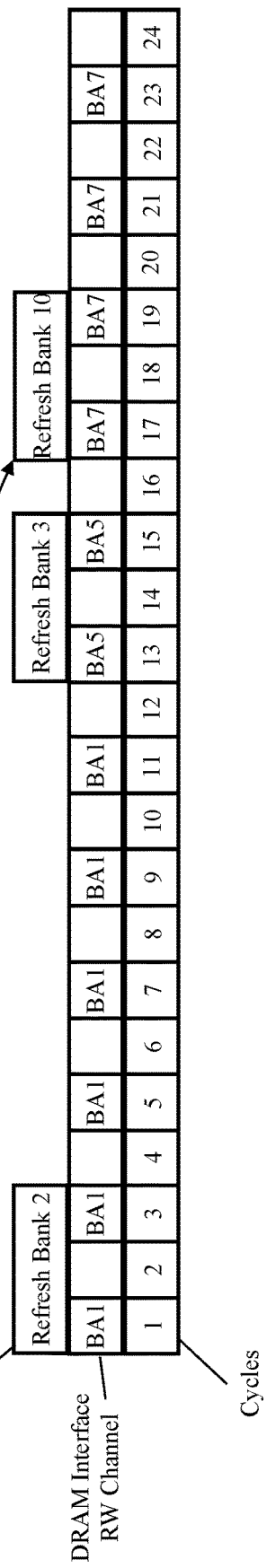

FIG. 5J illustrates the scheduling of the PBR command in entry #3. The PBR command has been scheduled to start initially at cycle 17, and are is projected to be completed during cycle 29.

These figures illustrate basic scheduling of memory access commands and PBR commands which avoids the interference and the unpredictability of previous methods. However, FIGS. 6A-M illustrate an alternative approach to scheduling that combines the predictability of the present example with the higher throughput enabled by the more granular scheduling illustrated in FIGS. 6A-M.

FIGS. 6A-M illustrates another example operation of a memory controller in which some embodiments of the invention may be implemented.

Figure 6A:
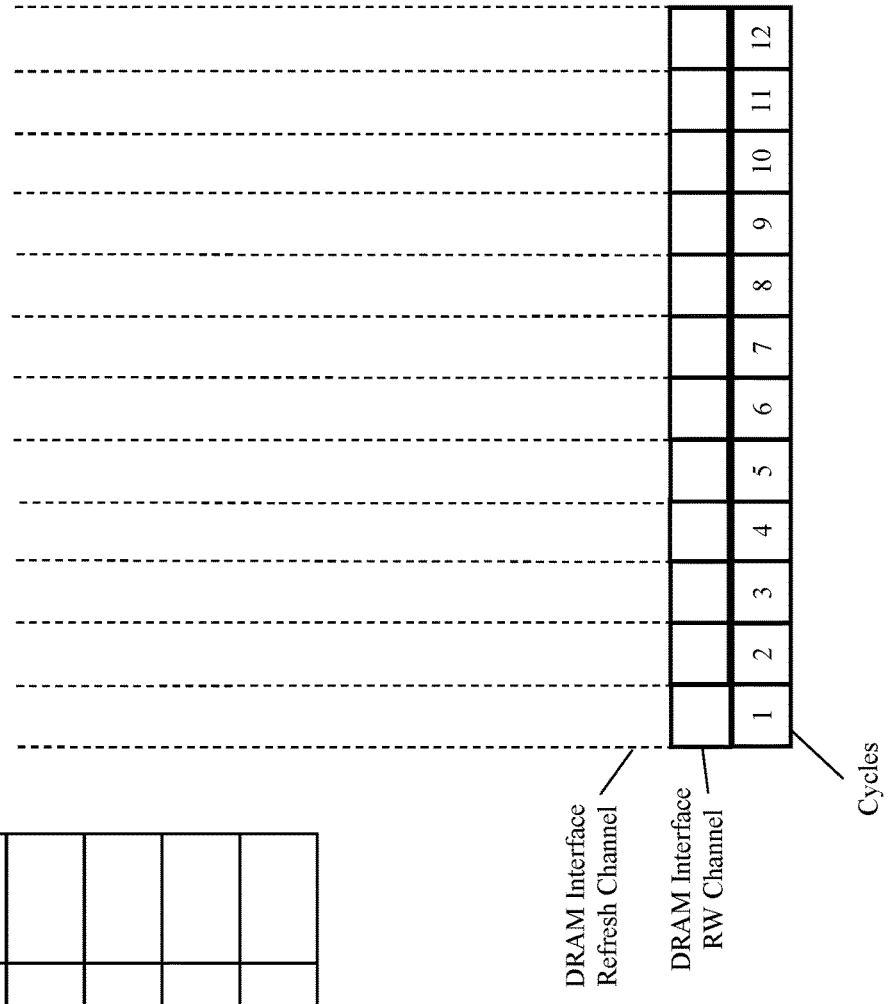
FIGS. 6A-M illustrates another example operation of a memory controller in which some embodiments of the invention may be implemented.

Similar to FIG. 5A, FIG. 6A starts with a blank slate. Specifically, the illustration includes read/write (RW) and per-bank refresh (PBR) command queue 634, and an illustrative view of the refresh activity on the DRAM interface refresh channel, read/write activity on the DRAM interface RW channel, and the corresponding cycles.

As above, the RW and PBR command queue 634 is illustrated has having five columns: entry #, refresh bank, RW bank, R/W, and burst length. Furthermore, the entry # column is illustrated as being populated with the numbers 1-4 for simplicity though in an actual system the entries numbers may or may not be necessary. Furthermore, the DRAM interface refresh channel and the DRAM interface RW channel are illustrated as blank place holders. Thereby, FIG. 6A illustrates an initial empty state of the structures. Furthermore, FIGS. 6A-M are illustrated using the same series of commands as discussed in FIGS. 5A-J and in order to more clearly render the differences between the examples.

Figure 6B:
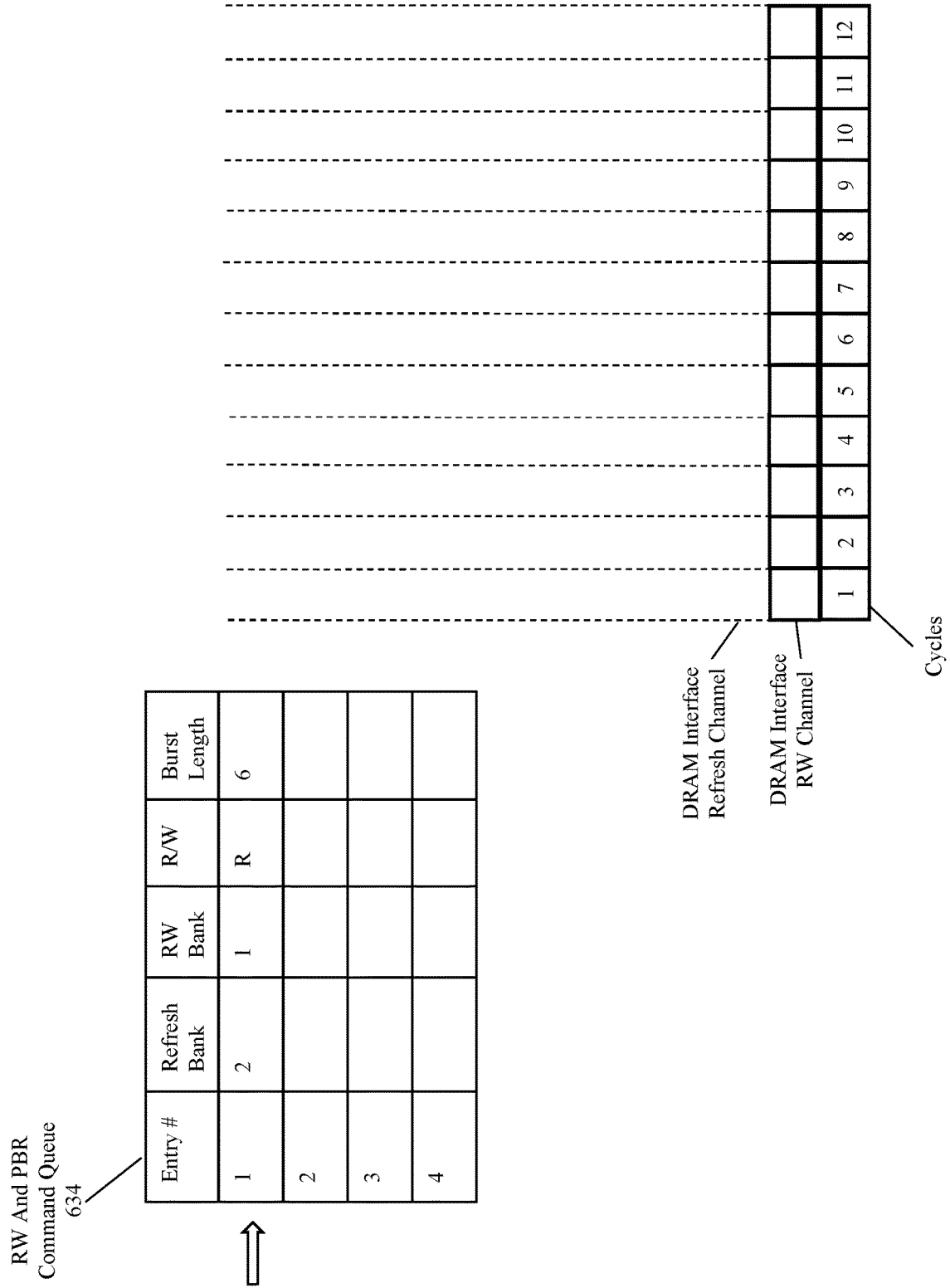

FIG. 6B, illustrates the receipt of a first pair of commands corresponding to a first entry. Where the first entry has been stored as entry #1 and includes a PBR command for bank 2, and a burst read command on bank 1 of length 6.

Figure 6C:
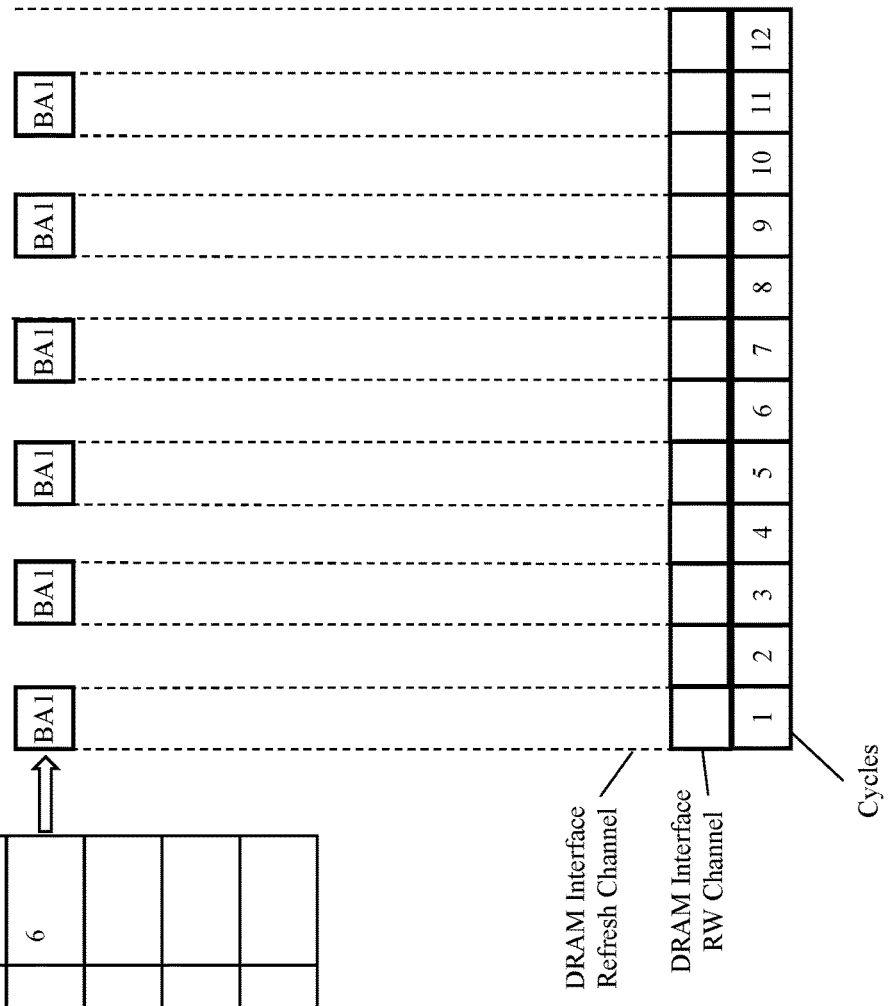
Figure 6D:
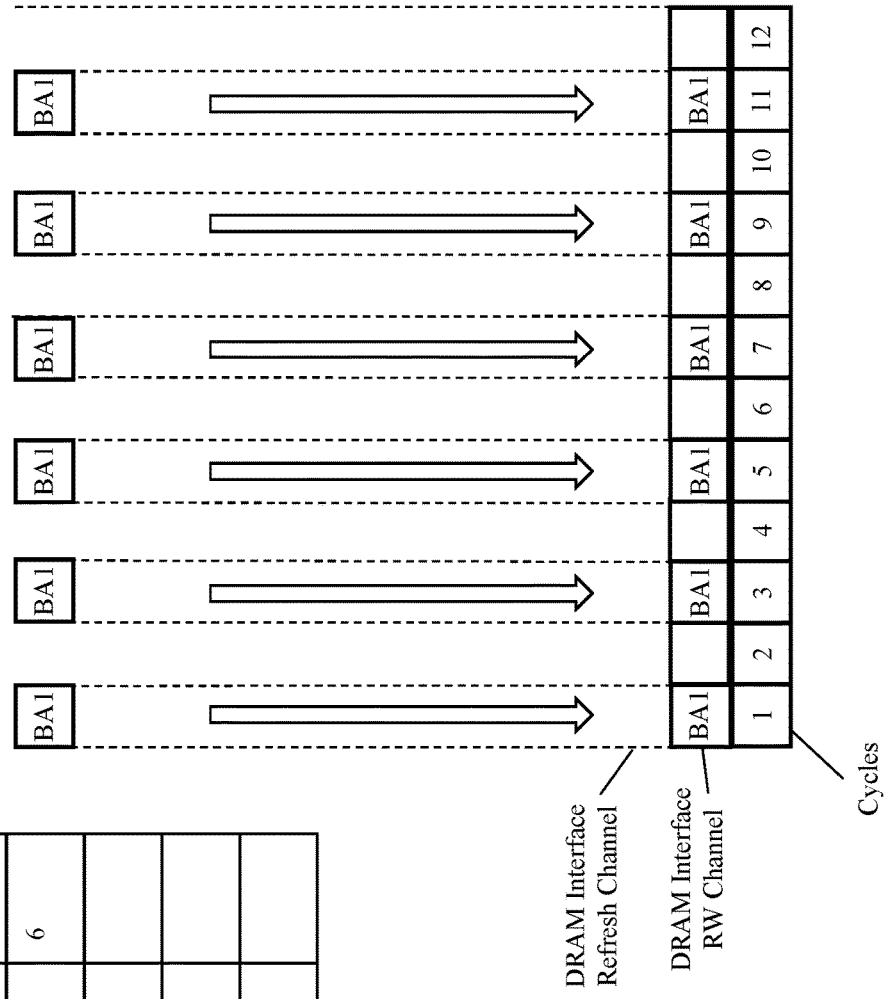

FIGS. 6C and 6D illustrate the scheduling of the read command, where relative timing between the burst is illustrated in FIG. 6C as occurring during alternating cycles and those bursts are then placed in the row corresponding to the DRAM interface RW channel for illustration at the corresponding cycles of 1, 3, 5, 7, 9, and 11 respectively in FIG. 6D, at which point the read command could be issued to the memory.

Figure 6E:
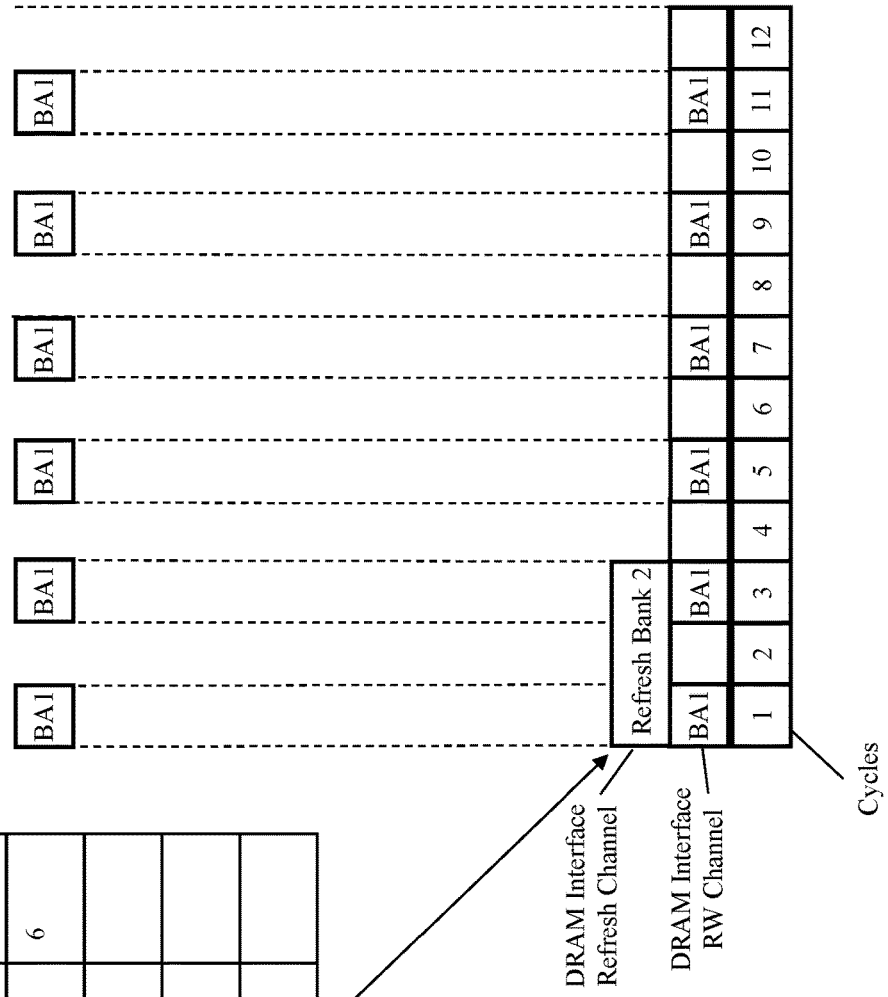

FIG. 6E illustrates the scheduling of the PBR command, as illustrated by the addition of refresh bank 2 in the row corresponding to the DRAM interface refresh channel. As discussed previously, in some embodiments, the PBR command and the memory access command could be issued at the same time, however, in other embodiments the commands may be separated by one or more clock cycles as is necessary.

Figure 6F:
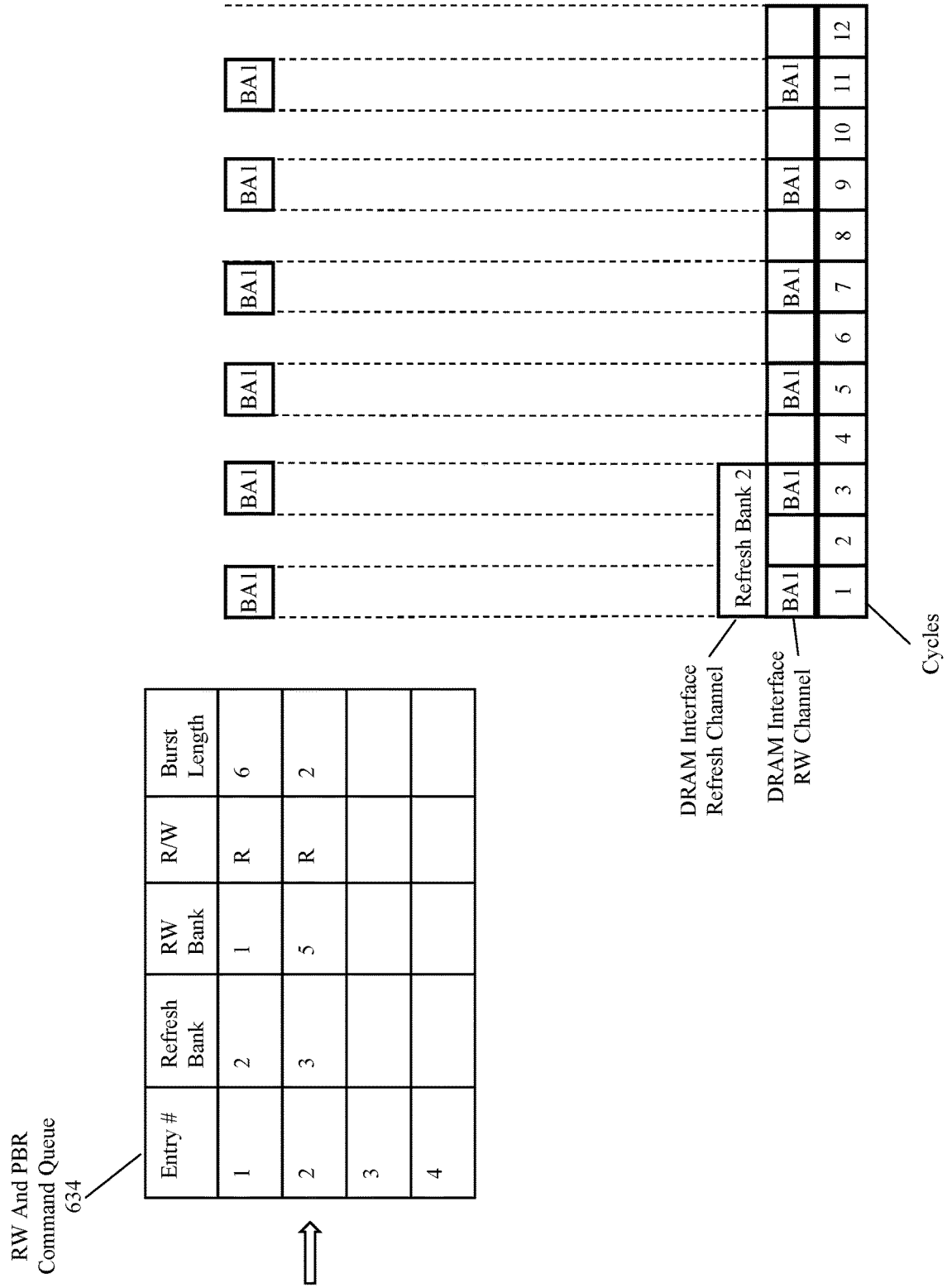

FIG. 6F, illustrates the receipt of a second pair of commands corresponding to a second entry. Where the second entry has been stored as entry #2 and includes a PBR command for bank 3, and a burst read command on bank 5 of length 2.

Figure 6G:
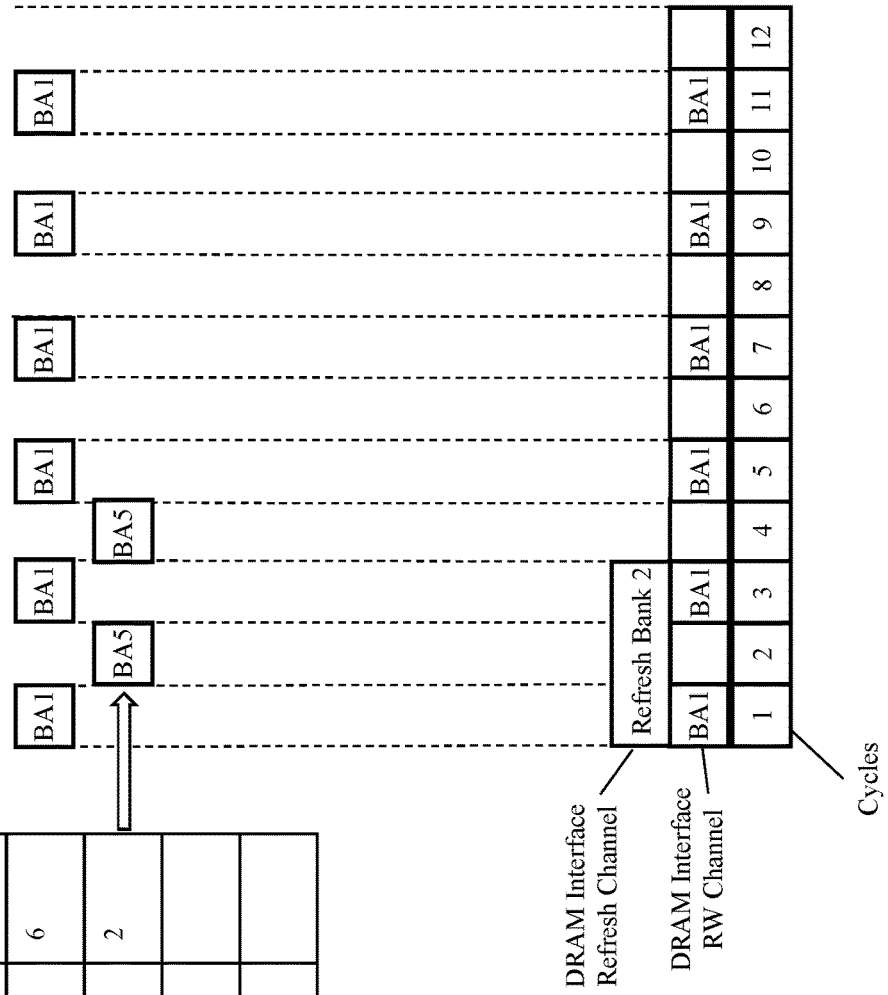
Figure 6H:
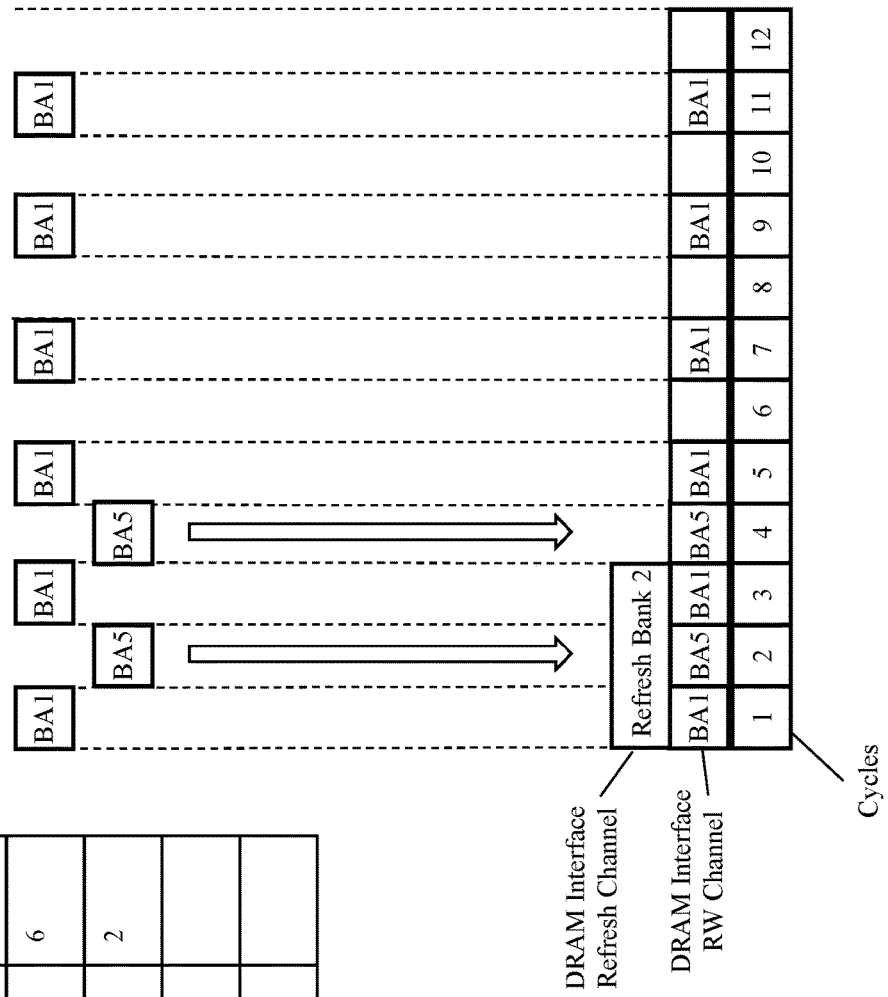

FIGS. 6G and 6H illustrate the scheduling of the second read command, where relative timing between the bursts is illustrated in FIG. 6G as occurring during alternating cycles and those bursts are then placed in the row corresponding to the DRAM interface RW channel for illustration at the corresponding cycles of 2 and 4 respectively in FIG. 6H, at which point the read command is scheduled, and if the memory is ready, a corresponding command could be issued to the memory.

Furthermore, what is of particular interest here is that the scheduler can now place the bursts of the second read command between the bursts of the first read command. This provides efficient and thorough utilization of the available memory bandwidth.

Figure 6I:
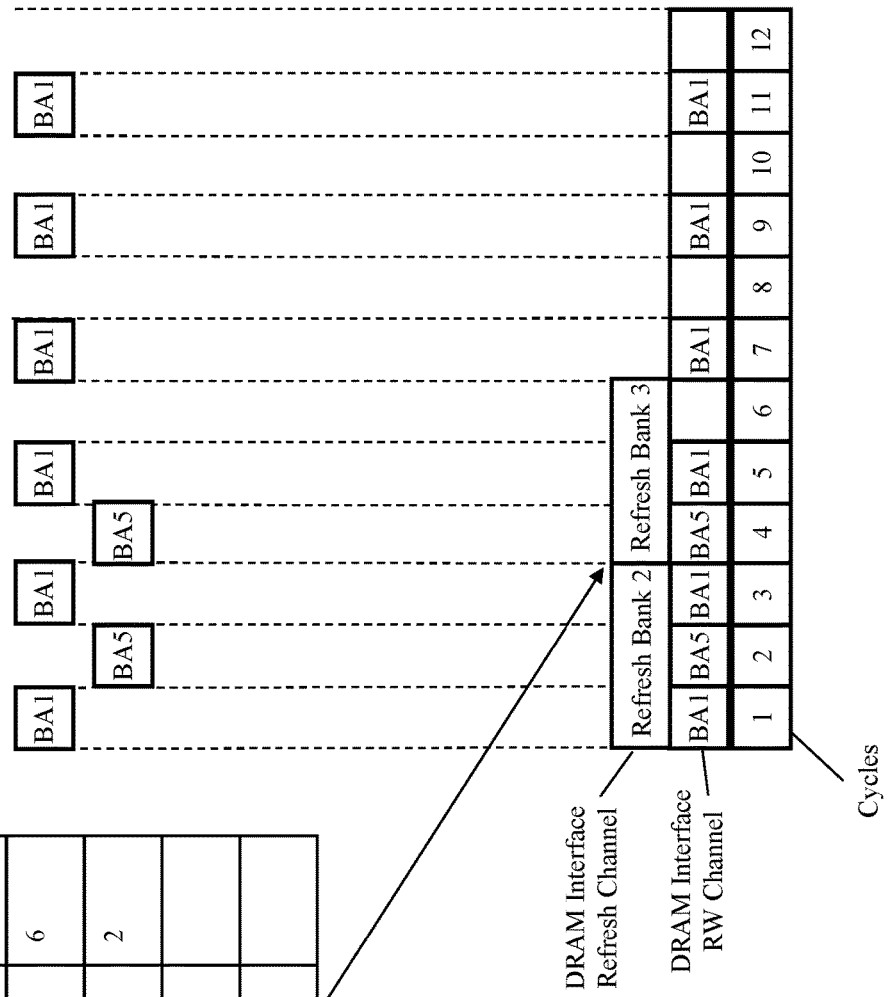

FIG. 6I illustrates the scheduling of the second PBR command, as illustrated by the addition of refresh bank 3 in the row corresponding to the DRAM interface refresh channel.

Figure 6J:
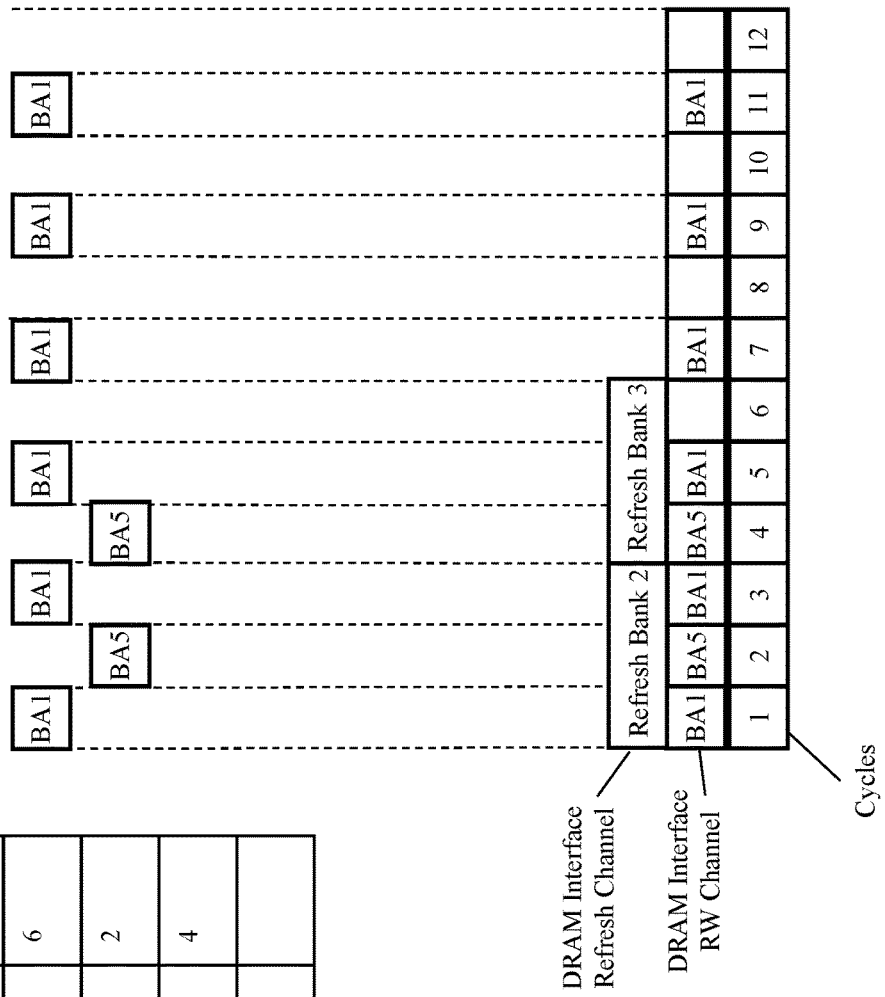

FIG. 6J, illustrates the receipt of a third pair of commands corresponding to a third entry. Where the third entry has been stored as entry #3 and includes a PBR command for bank 10, and a burst read command on bank 7 of length 4.

Figure 6K:
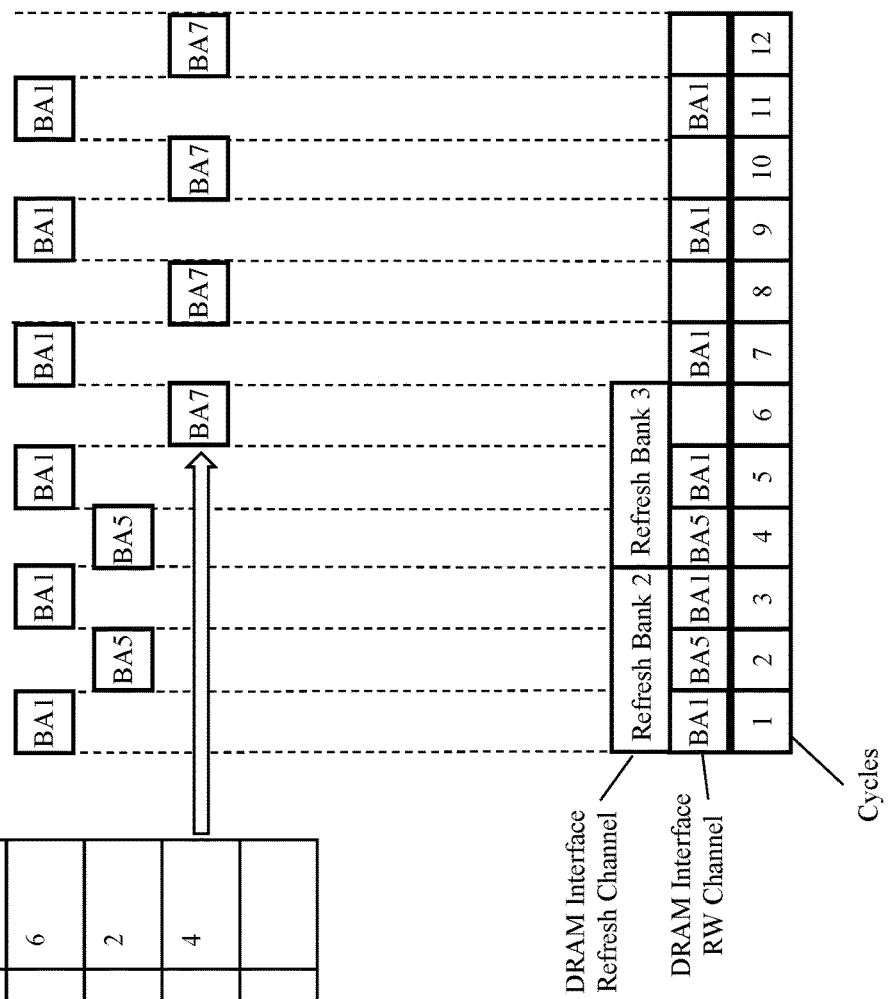
Figure 6L:
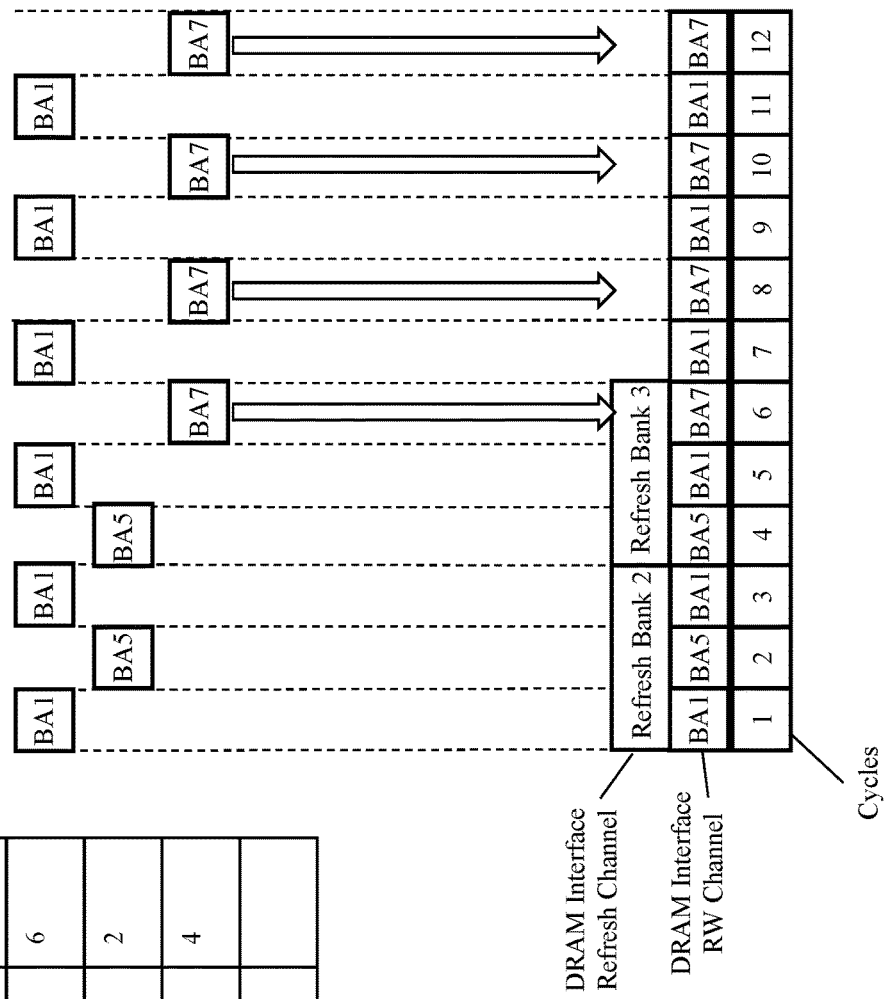

FIGS. 6K and 6L illustrate the scheduling of the third read command, where relative timing between the burst is illustrated in FIG. 6K as occurring during alternating cycles and those bursts are then placed in the row corresponding to the DRAM interface RW channel for illustration at the corresponding cycles of 6, 8, 10, and 12 respectively in FIG. 6L, at which point the read command is scheduled, and if the memory is ready, a corresponding command could be issued to the memory.

As before, the scheduler can now place the bursts of the third read command between the bursts of the first read command. This continues to provide efficient and thorough utilization of the available memory bandwidth.

Figure 6M:
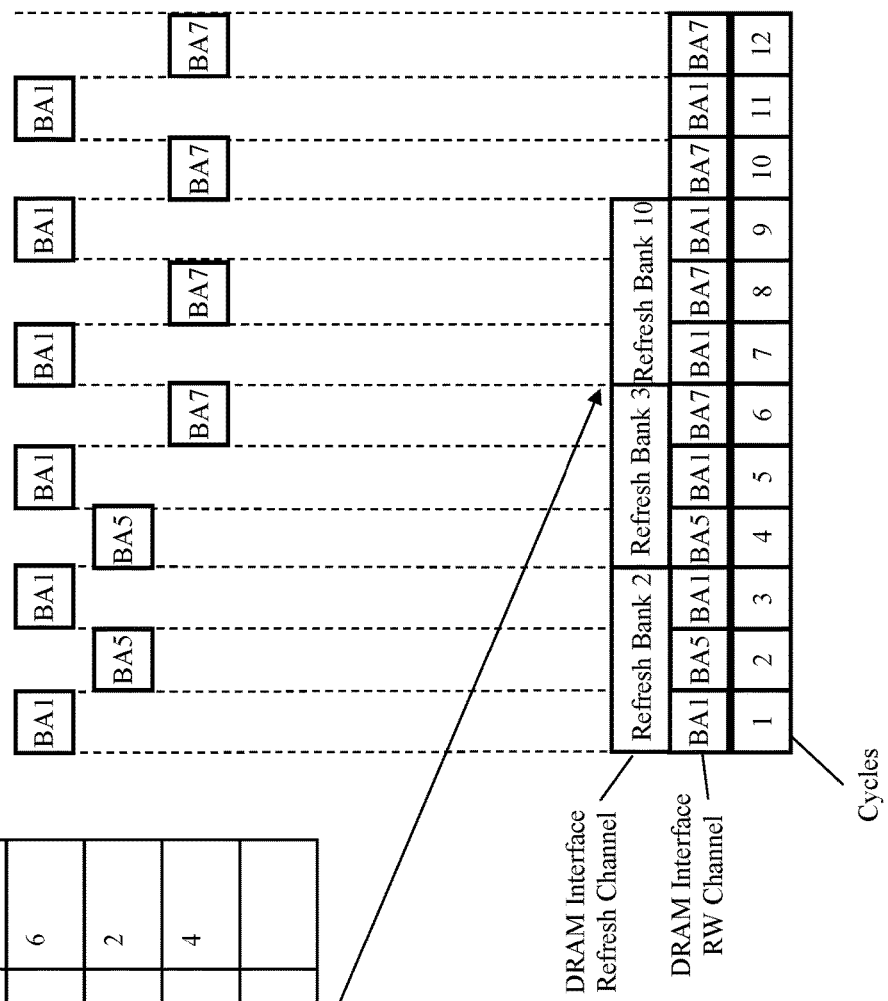

Finally, FIG. 6M illustrates the scheduling of the third PBR command, as illustrated by the addition of refresh bank 3 in the row corresponding to the DRAM interface refresh channel.

This scheduling method in combination with at least the PBR Command aspects of the present disclosure provides for efficient utilization of the memory bandwidth, while avoiding unnecessary stalls caused by bank group rotation and/or per bank refresh collisions with memory access commands, by allowing the accessing element to not only initiate the read/write commands, but also to initiate the PBR commands, to create a more predictable and efficient memory interface.

Additional logic could further be included to execute out of order memory access (burst reordering), where a scheduled PBR conflicts with an upcoming access or where two subsequent accesses attempt to access the same bank.

System Architecture Overview

Figure 7:
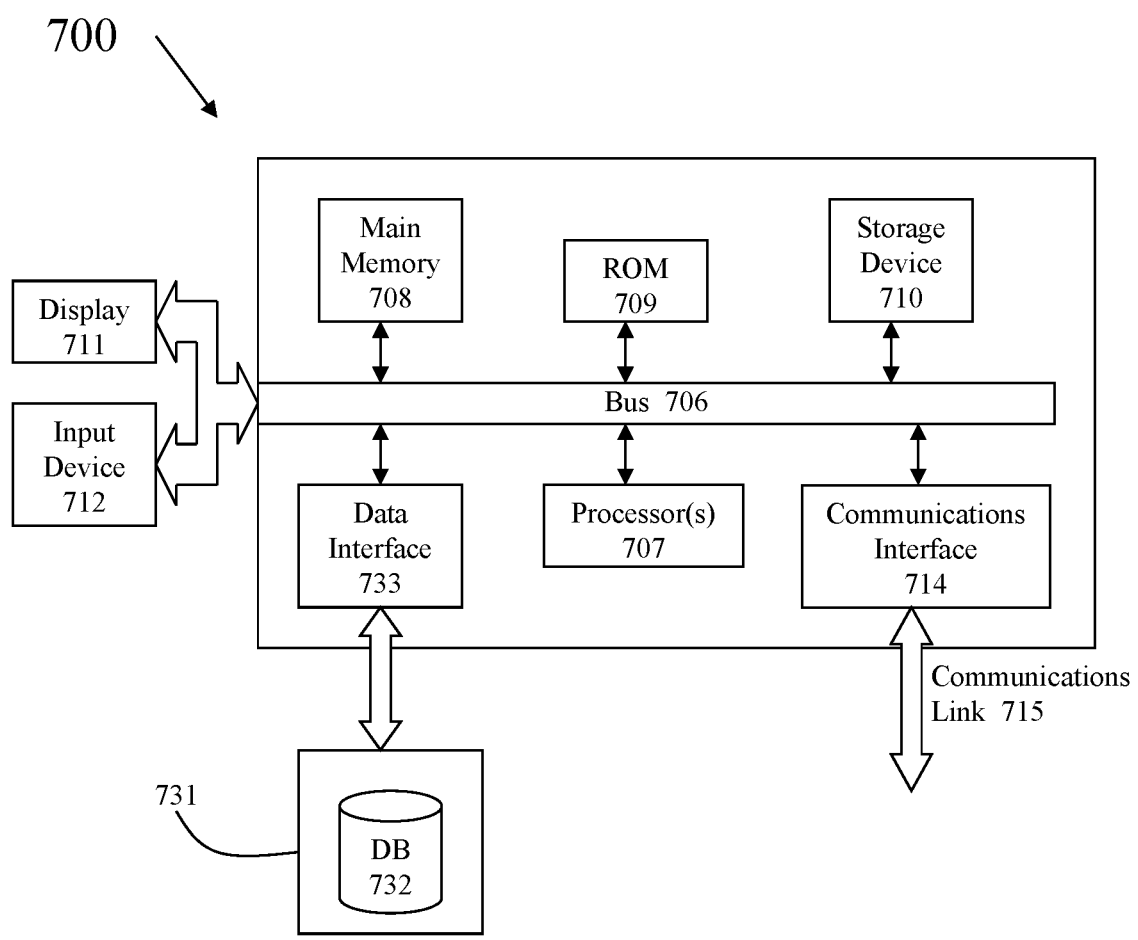
FIG. 7 is a block diagram of an illustrative computing system suitable for implementing an embodiment of the present invention.

FIG. 7 is a block diagram of an illustrative computing system suitable for implementing an embodiment of the present invention. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control.

According to one embodiment of the invention, computer system 700 performs specific operations by processor 707 executing one or more sequences of one or more instructions contained in system memory 708. Such instructions may be read into system memory 708 from another computer readable/usable medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, e.g., application code, through communication link 715 and communication interface 714. Received program code may be executed by processor 707 as it is received, and/or stored in disk drive 710, or other non-volatile storage for later execution. Computer system 700 may communicate through a data interface 733 to a database 732 on an external storage device 731.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A memory controller comprising at least:
   a per-bank refresh interface, the per-bank refresh interface receiving one or more per-bank refresh commands from a requesting apparatus external to the memory controller;
   a system bus interface, the system bus interface receiving one or more memory access commands from the requesting apparatus external to the memory controller, the requesting apparatus generating the one or more per-bank refresh commands and the one or more memory access commands; and
   a command queue, the command queue comprising at least one or more storage elements, the storage elements storing one or more per-bank refresh commands and one or more memory access commands from the requesting apparatus external to the memory controller.

2. The memory controller of claim 1, wherein the command queue stores a respective per-bank refresh command of the one or more per-bank refresh commands with a respective memory access command of the one or more memory access commands in a single entry, and wherein the single entry maintains a relative timing relationship between the respective per-bank refresh command and the respective memory access command.

3. The memory controller of claim 1, wherein the memory controller is configured to receive a respective per-bank refresh command of the one or more per-bank refresh commands synchronously with a respective memory access command of the one or more memory access commands.

4. The memory controller of claim 1, wherein the memory controller is configured to receive the one or more per-bank refresh commands asynchronously with the one or more memory access commands.

5. The memory controller of claim 1, wherein the memory controller is configured to issue one of the one or more per-bank refresh commands in parallel or in series with one of the one or more memory access commands to a physical interface electrically coupled to a memory bank of a memory.

6. The memory controller of claim 5, wherein the memory comprises a high bandwidth memory dynamic random access memory.

7. The memory controller of claim 1, wherein at least some of the one or more per-bank refresh commands and the one or more memory access commands to the memory controller are received from a processing element.

8. The memory controller of claim 1, wherein the memory controller further comprises a transaction processing module, the transaction processing module being configured to perform scheduling of received memory access commands and per-bank refresh commands.

9. The memory controller of claim 8, wherein the transaction processing module supports burst reordering of memory access commands and per-bank refresh commands.

10. The memory controller of claim 9, wherein the transaction processing module is further configured to monitor issued commands for retirement from the command queue.

11. A method, comprising:
- receiving one or more per-bank refresh commands from a requesting apparatus external to a memory controller, the one or more per-bank refresh commands received at a per-bank refresh interface of the memory controller;
- receiving one or more memory access commands from the requesting apparatus external to the memory controller, the one or more memory access commands received at a system bus interface of the memory controller, the requesting apparatus generating the one or more per-bank refresh commands and the one or more memory access commands; and
- generating one or more entries in a command queue of the memory controller comprising at least one or more storage elements, the one or more entries in the command queue corresponding to the one or more per-bank refresh commands and the one or more memory access commands from the requesting apparatus external to the memory controller.

12. The method of claim 11, wherein a respective entry of the one or more entries in the command queue correlates a respective per-bank refresh command of the one or more per-bank refresh commands with a respective memory access command of the one or more memory access commands in a single entry, and wherein the single entry maintains a relative timing relationship between the respective per-bank refresh command and the respective memory access command.

13. The method of claim 11, wherein a respective per-bank refresh command of the one or more per-bank refresh commands is received synchronously with a respective memory access command of the one or more memory access commands.

14. The method of claim 11, wherein a respective per-bank refresh command of the one or more per-bank refresh commands is received asynchronously with a respective memory access command of the one or more memory access commands.

15. The method of claim 11, wherein one of the one or more per-bank refresh commands is issued in parallel or in series with one of the one or more memory access commands to a memory.

16. The method of claim 15, wherein the memory comprises a high bandwidth memory dynamic random access memory.

17. The method of claim 11, wherein at least some of the one or more per-bank refresh commands and the one or more memory access commands to are received from a processing element.

18. The method of claim 11, further comprising performing scheduling of received memory access commands and per-bank refresh commands.

19. The method of claim 18, wherein scheduling of received memory access commands and per-bank refresh commands includes burst reordering of memory access commands and per-bank refresh commands.

20. The method of claim 11, further comprising monitoring issued commands for retirement from the command queue.

* * * * *